US012798235B2

(12) United States Patent
Tsutsui et al.

(10) Patent No.: US 12,798,235 B2
(45) Date of Patent: Nov. 17, 2026

(54) LIQUID EJECTION HEAD AND METHOD OF PRODUCING LIQUID EJECTION HEAD

(71) Applicant: CANON KABUSHIKI KAISHA, Tokyo (JP)

(72) Inventors: Satoshi Tsutsui, Kanagawa (JP); Yohei Hamade, Tokyo (JP); Miho Ishii, Kanagawa (JP); Hikaru Sugimoto, Kanagawa (JP); Erika Kobatake, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 129 days.

(21) Appl. No.: 18/930,598

(22) Filed: Oct. 29, 2024

(65) Prior Publication Data

US 2025/0135781 A1 May 1, 2025

(30) Foreign Application Priority Data

Nov. 1, 2023 (JP) ................................ 2023-187716

(51) Int. Cl.
*B41J 2/14* (2006.01)
*B41J 2/16* (2006.01)
*G03F 7/00* (2006.01)
*G03F 7/038* (2006.01)

(52) U.S. Cl.
CPC ....... *B41J 2/14016* (2013.01); *B41J 2/14201* (2013.01); *B41J 2/162* (2013.01); *B41J 2002/14306* (2013.01); *B41J 2/1631* (2013.01); *G03F 7/0015* (2013.01); *G03F 7/0035* (2013.01); *G03F 7/0382* (2013.01)

(58) Field of Classification Search
CPC .... B41J 2/14016; B41J 2/14201; B41J 2/162; B41J 2/1631; B41J 2002/14306; B41J 2/1628; B41J 2/1629; B41J 2/1603; B41J 2/1639; B41J 2/1645; B41J 2/1646; G03F 7/0015; G03F 7/0035; G03F 7/0382; G03F 7/038; C08G 59/38
See application file for complete search history.

(56) References Cited

FOREIGN PATENT DOCUMENTS

JP H0698773 B2 * 12/1994 ............ B41J 2/1632
JP 2013018272 A 1/2013

* cited by examiner

*Primary Examiner* — Justin Seo
(74) *Attorney, Agent, or Firm* — Canon U.S.A., Inc. IP Division

(57) ABSTRACT

A liquid ejection head includes a substrate, an ejection port forming member, and a channel forming member, in which the ejection port forming member and the channel forming member are provided on the substrate. The channel forming member is a cured substance of a photosensitive resin composition formed of a resin and a compound that contains a ligand having a lone electron pair, and is in contact with the substrate including an inorganic material layer on a surface thereof, and a content of the compound that contains a ligand having a lone electron pair is in a range of 1.0% by mass to 5.0% by mass with respect to 100% by mass of an epoxy resin contained in the photosensitive resin composition.

18 Claims, 3 Drawing Sheets

LIQUID EJECTION HEAD AND METHOD OF PRODUCING LIQUID EJECTION HEAD

BACKGROUND

Field

The present disclosure relates to a liquid ejection head and a method of producing a liquid ejection head.

Description of the Related Art

A liquid ejection head that ejects a liquid is used in a liquid ejection device such as an ink jet recording device, and includes an ejection port forming member, a channel forming member, and a substrate. The channel forming member is provided on the substrate, defines a channel of a liquid, and has a liquid ejection port communicating with the channel in many cases.

The substrate is formed with a liquid supply port communicating with the channel of the channel forming member, and includes, on a surface side of the substrate, an energy generating element that generates ejection energy. The liquid is supplied to the channel from the liquid supply port, energy is applied thereto by the energy generating element, the liquid is ejected from the liquid ejection port, and thus the liquid lands on a recording medium such as paper so that an image can be formed.

An insulating layer or a protective layer that covers the energy generating element is provided on the substrate or an inorganic material layer is provided thereon in many cases for various other purposes. In addition, the channel forming member or other structures on the substrate are known to be formed with an organic material layer.

Particularly, in a case where the organic material layer is formed of a photosensitive resin, the channel forming member and other structures can be formed with high accuracy by photolithography. For example, Japanese Patent Laid-Open No. 2013-18272 discloses a method of producing a liquid ejection head in which a dry film of a photosensitive resin layer that is formed into a liquid channel is formed on a substrate having an inorganic material layer by a lamination method and exposed to light in the form of a channel, a nozzle portion connecting an ejection port and a channel and the dry film of the photosensitive resin layer that is formed into an ejection port are laminated on the photosensitive resin layer that is formed into the channel, and uncured portions of each photosensitive resin layer are removed all at once by development after the nozzle portion and the dry film are exposed to light in the form of an ejection port, to form a channel, a nozzle portion, and an ejection port.

However, as a demand for ink jet image recording has been sophisticated, the performance required for an ink has also been sophisticated, and a solvent having a high boiling point is added to an ink in some cases from the viewpoint of fixing properties to a recording material. The type of ink obtained in such a manner may deform a channel forming member by permeating into a photosensitive resin layer formed of an epoxy resin or the like. Therefore, in a case of using such a type of ink, deformation of the channel forming member with the configuration of the liquid ejection head described in Japanese Patent Laid-Open No. 2013-18272 proceeds at a pace faster than that of the type of ink used in the related art, and thus there is room for improvement in terms of long-term reliability. For example, deformation of the channel forming member due to the long-term use of an ink jet recording head may cause peeling of an external member from the substrate or may prevent desired ink ejection performance from obtaining.

SUMMARY

Therefore, the present disclosure provides a liquid ejection head that can prevent permeation of an ink into a channel forming member so that the channel forming member can be suppressed from being peeled off from a substrate even when an ink with high permeability is used and that has excellent pattern reproducibility and a satisfactory print quality. According to some embodiments, a liquid ejection head includes: a substrate; an ejection port forming member; and a channel forming member, in which the ejection port forming member and the channel forming member are provided on the substrate, the channel forming member is a cured substance of a photosensitive resin composition formed of a resin and a compound that contains a ligand having a lone electron pair, and is in contact with the substrate including an inorganic material layer on a surface thereof, and a content of the compound that contains a ligand having a lone electron pair is in a range of 1.0% by mass to 5.0% by mass with respect to 100% by mass of an epoxy resin contained in the photosensitive resin composition.

According to another embodiment of the present disclosure, a method of producing a liquid ejection head includes: forming a first resin layer formed of a photosensitive resin composition (1) on a substrate and performing light exposure and development on the first resin layer to form a channel forming member; and laminating a second resin layer formed of a photosensitive resin composition (2) on the formed channel forming member and performing light exposure and development on the second resin layer to form an ejection port forming member, in which the photosensitive resin composition (1) is a photosensitive resin composition containing an epoxy resin, a polymerization initiator, and a compound that contains a ligand having a lone electron pair, and a content of the compound that contains a ligand having a lone electron pair is 1.0% by mass or greater and less than 10.0% by mass with respect to 100% by mass of the epoxy resin.

Further features of the present disclosure will become apparent from the following description of exemplary embodiments with reference to the attached drawings.

DESCRIPTION OF THE EMBODIMENTS

Figure 1A:
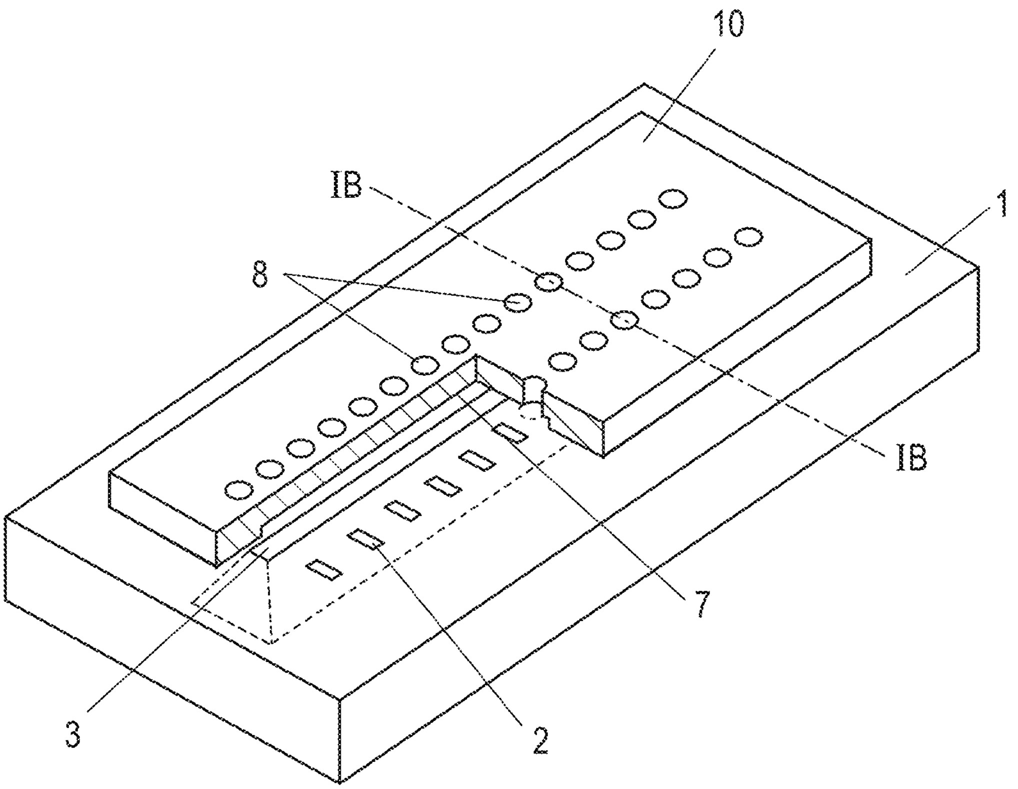
FIG. 1A is a schematic perspective view showing a configuration of a liquid ejection head according to an embodiment of the present disclosure.

Hereinafter, various exemplary embodiments, features, and aspects of the present disclosure will be described with reference to the accompanying drawings. In the description below, a liquid ejection head and a production method thereof will be described based on the present disclosure, but the liquid ejection head and the production method thereof according to the present disclosure are not limited thereto. Further, in the description below, the configurations having the same functions are denoted by the same reference numerals in the drawings, and the description thereof is not provided in some cases.

Further, in the present disclosure, the description of a numerical range of "XX or greater and YY or less" or "XX to YY" denotes a numerical range including the endpoints as the lower limit and the upper limit unless otherwise specified. In a case where numerical ranges are described in a stepwise manner, the upper limits and the lower limits of each of the numerical ranges can be used in any combination.

Liquid Ejection Head

FIG. 1A is a schematic perspective view showing a liquid ejection head according to an embodiment of the present disclosure. Further, FIG. 1B is a schematic cross-sectional view showing the liquid ejection head according to the embodiment of the present disclosure, as viewed in a plane perpendicular to a substrate taken along line IB-IB in FIG. 1A.

Figure 1B:
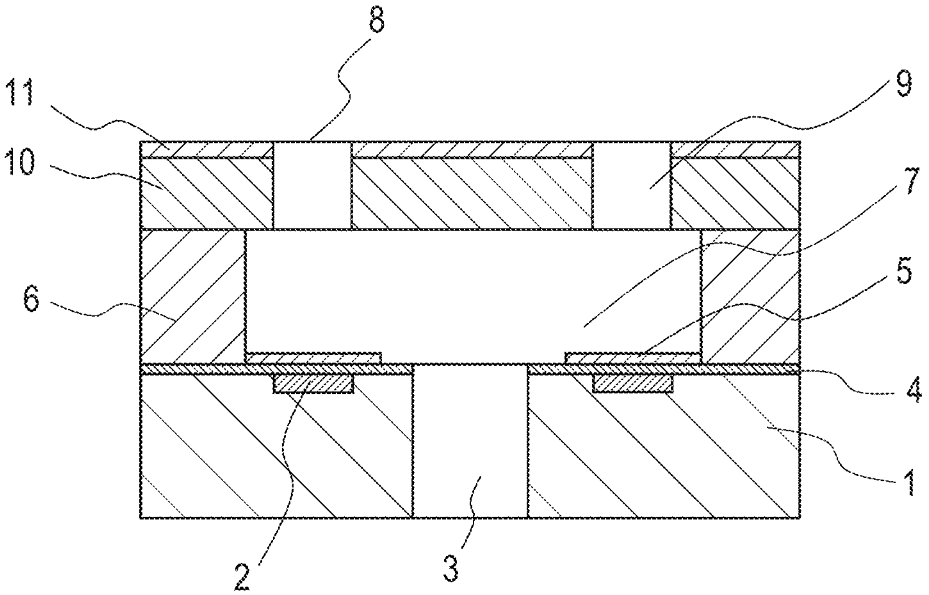
FIG. 1B is a schematic cross-sectional view taken along line IB-IB of FIG. 1A.

The liquid ejection head shown in FIGS. 1A and 1B includes a substrate 1 on which an energy generating element 2 generating energy for ejecting a liquid is formed at a predetermined pitch. For example, a silicon substrate formed of silicon may be used as the substrate 1. The silicon substrate is a single crystal of silicon and can have a surface with a crystal orientation of (100). Examples of the energy generating element 2 include an electrothermal conversion element and a piezoelectric element, and for example, tantalum silicon nitride (TaSiN) can be used as a resistance heating element in the electrothermal conversion element. The energy generating element 2 may be provided in contact with the surface of the substrate 1 or partially hollow with respect to the surface of the substrate 1. A control signal input electrode (not shown) for operating the energy generating element 2 is connected to the energy generating element 2. Further, a liquid supply port (hereinafter, also referred to as "supply port") 3 that supplies an ink is opened in the substrate 1.

An inorganic material layer 4 and a protective layer 5 are formed on the surface side of the substrate 1. Examples of the inorganic material layer 4 include a metal film formed of at least one selected from Ta, Ir, W, Ti, Pt, Au, Pd, Cu, Al, and Si and an inorganic film formed of silicon oxide ($SiO_2$), silicon nitride (SiN), silicon carbide (SiC), silicon carbonitride (SiCN), or silicon carbonate (SiOC). In FIGS. 1A and 1B, the inorganic material layer 4, particularly, a heat accumulating layer or a layer with insulating properties is used as an insulating layer. The protective layer 5 protects the energy generating element and is formed of, for example, Ta or Ir. The inorganic material layer 4 may cover the energy generating element.

In FIGS. 1A and 1B, the inorganic material layer 4 is formed on almost the entire surface of the substrate 1. A side wall of a channel 7 is formed on the inorganic material layer 4 by a channel forming member 6. Further, an ejection port forming member 10 having an ejection port 8 and a nozzle portion 9 is formed on the channel forming member 6 and the channel 7. Further, a liquid-repellent layer 11 is formed on the ejection port forming member 10 as necessary.

The liquid ejection head has a configuration in which a liquid such as an ink to be supplied through the channel 7 from the supply port 3 is ejected as liquid droplets (ink droplets) from the ejection port 8 via the nozzle portion 9 by applying a pressure thereto, which is generated by the energy generating element 2.

Method of Producing Liquid Ejection Head

Next, a method of producing the liquid ejection head according to the present embodiment will be described with reference to FIGS. 2A and 2B and FIGS. 3A to 3H.

Figure 2A:
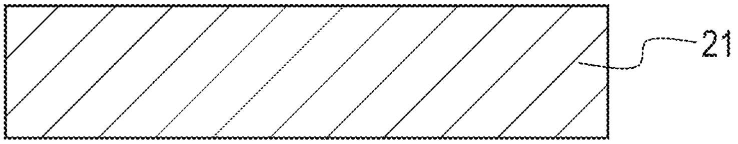
FIG. 2A is a schematic cross-sectional view showing a step of preparing a film base material.
Figure 2B:
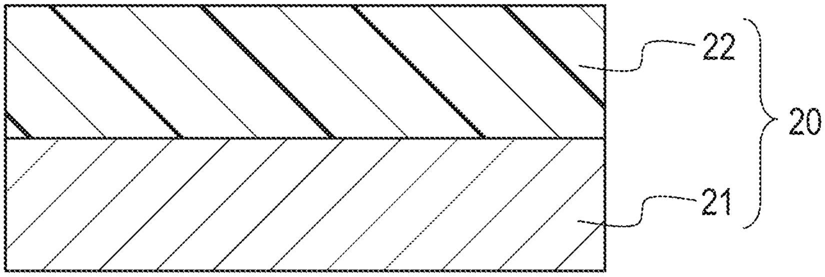
FIG. 2B is a schematic cross-sectional view showing a step of preparing a transfer body.

FIGS. 2A and 2B are schematic cross-sectional views showing an embodiment of a method of producing a transfer body (dry film) including a resin layer formed of a photosensitive resin composition.

FIGS. 3A to 3H are schematic cross-sectional views showing an embodiment of the method of producing the liquid ejection head of the present disclosure, which are views showing the same cross section as in FIG. 1B in a completed state.

First, a film base material 21 formed of polyethylene terephthalate (PET) or polyimide (PI) is prepared as shown in FIG. 2A. Next, as shown in FIG. 2B, a film base material 21 is coated with the photosensitive resin composition by a spin coating method, a slit coating method, or the like, and the photosensitive resin composition is pre-baked to form a resin layer 22 formed of the photosensitive resin composition, thereby preparing a transfer body 20.

In a case where the photosensitive resin composition is transferred to the substrate having a liquid supply port that has been formed in advance, the photosensitive resin composition can at least have a weight-average molecular weight of greater than 5000. Further, the photosensitive resin composition may contain an epoxy resin containing two functional groups (bifunctional), such as an epoxy group and a hydroxyl group, at a terminal and may further contain an epoxy resin containing three functional group (trifunctional) at a terminal. Further, the photosensitive resin composition may be a negative photosensitive epoxy resin composition further containing a polyhydric alcohol, which does not contain a perfluoroalkyl group or a perfluoroalkylene group, a photoacid generator, and a solvent. The composition will be described below.

A step of producing the liquid ejection head using such a transfer body will be described with reference to FIGS. 3A to 3H.

Figure 3A:
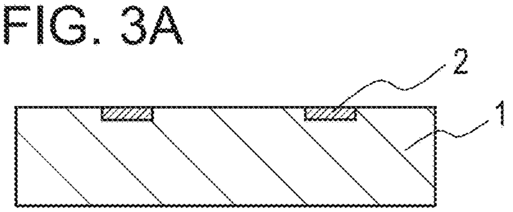
FIG. 3A is a schematic cross-sectional view showing a substrate.

As shown in FIG. 3A, the substrate 1 including the energy generating element 2 on the surface side thereof is prepared.

Figure 3B:
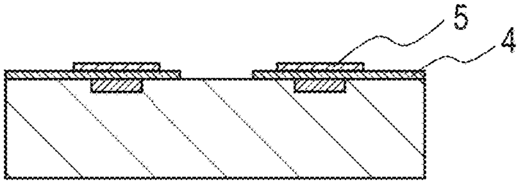
FIG. 3B is a schematic cross-sectional view showing the substrate on which an inorganic material layer is formed.

As shown in FIG. 3B, the inorganic material layer 4 is formed on the surface side of the substrate 1 such that the inorganic material layer 4 covers the energy generating element 2. Further, the protective layer 5 is formed above the energy generating element 2 such that the protective layer 5 is in contact with the inorganic material layer 4. The inorganic material layer 4 and the protective layer 5 are patterned as necessary.

Figure 3C:
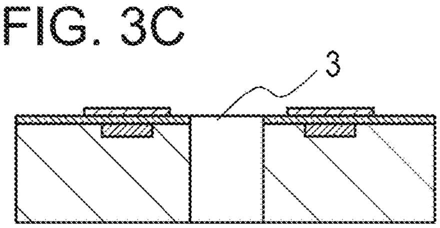
FIG. 3C is a schematic cross-sectional view showing the substrate in which an ink supply port is formed.

As shown in FIG. 3C, the supply port 3 that supplies an ink is formed by penetrating through the substrate. The supply port 3 is formed at a desired position by performing wet etching using an alkaline etchant such as tetramethylammonium hydroxide (TMAH) or dry etching such as reactive ion etching.

Figure 3D:
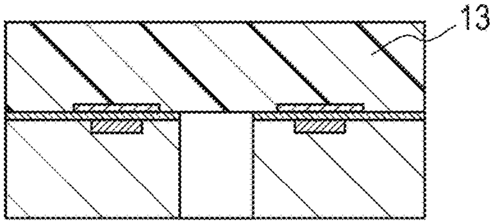
FIG. 3D is a schematic cross-sectional view showing the substrate on which a first resin layer is formed.

As shown in FIG. 3D, a first resin layer 13 is formed on the inorganic material layer 4 of the substrate 1 on which the energy generating element 2 and the supply port 3 are disposed using a lamination method, by being transferred onto the inorganic material layer 4. The first resin layer 13 is formed thereon by producing and using a transfer body formed of the photosensitive resin composition (1) by the method shown in FIGS. 2A and 2B. The first resin layer 13 may be formed by a method of transferring the transfer body to the substrate while heating the transfer body. Further, in a case where the supply port 3 is not disposed in the substrate, the first resin layer 13 may be formed by coating the substrate with the photosensitive resin composition (1) using a spin coating method, a slit coating method, or the like without forming the photosensitive resin composition (1) into a transfer body. The photosensitive resin composition (1) may be a cationic polymerization type epoxy resin composition in consideration of the adhesiveness to the ejection port forming member 10 described below, mechanical strength, stability with respect to a liquid such as an ink, resolution, and the like.

Since the thickness of the first resin layer 13 corresponds to the height of the channel, the thickness thereof is appropriately determined by the ejection design of the liquid ejection head and can be set to be in a range of, for example, 3 μm to 45 μm.

Figure 3E:
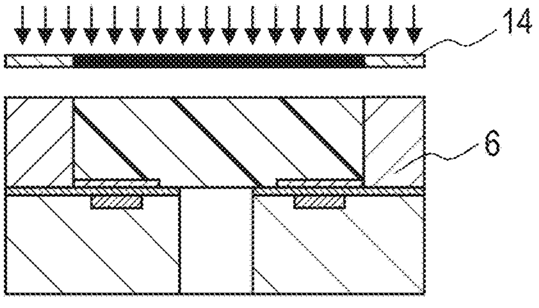
FIG. 3E is a schematic cross-sectional view showing a step of exposing the first resin layer to light.

As shown in FIG. 3E, the first resin layer 13 is pattern-exposed through a channel forming mask 14 having a channel pattern. Further, an exposed portion is cured by performing a heat treatment (post exposure bake; PEB) to form the channel forming member 6 formed of a cured substance of the photosensitive resin composition (1). The channel forming mask 14 is obtained by forming a light-shielding film such as a chromium film on a substrate formed of a material such as glass or quartz that transmits light having an exposure wavelength according to the pattern of a channel or the like. As an exposure device, a projection exposure device having a single-wavelength light source such as an i-line exposure stepper or a KrF stepper and a broad-wavelength light source of a mercury lamp such as a mask aligner MPA-600 Super (trade name, manufactured by CANON INC.) can be used.

Figure 3F:
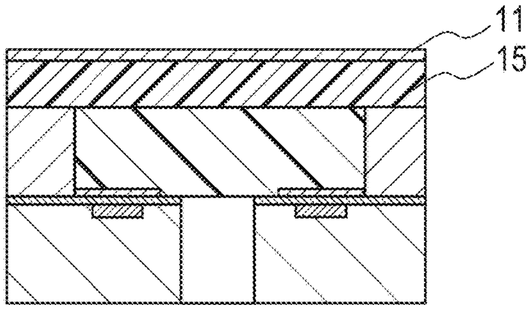
FIG. 3F is a schematic cross-sectional view showing the substrate obtained by forming a second resin layer on the first resin layer.

As shown in FIG. 3F, a second resin layer 15 formed of a photosensitive resin composition (2) is transferred to and formed on the unexposed first resin layer 13 and the channel forming member 6 by a lamination method. The second resin layer 15 is used by producing a transfer body by the method shown in FIGS. 2A and 2B similarly to the first resin layer 13. Further, a liquid-repellent layer 11 is formed on the second resin layer 15 as necessary. The second resin layer 15 can be formed of a cationic polymerization type epoxy resin composition in consideration of the adhesiveness to the channel forming member 6, mechanical strength, stability with respect to a liquid such as an ink, resolution, and the like.

Further, the thickness of the second resin layer 15 is not particularly limited because the thickness thereof is appropriately determined by ejection design of the liquid ejection head, but can be set to be in a range of, for example, 3 μm to 25 μm from the viewpoints of the mechanical strength and the like.

The liquid-repellent layer 11 is required to have liquid repellency to a liquid such as an ink, and a fluorine compound such as a cationic polymerizable perfluoroalkyl composition or perfluoropolyether composition can be used as a liquid-repellent agent. It is generally known that the perfluoroalkyl composition or the perfluoropolyether composition causes segregation of a fluoroalkyl chain at an interface between the composition and air when subjected to a bake treatment after application, and thus the liquid repellency of the surface of the liquid-repellent layer can be increased.

Figure 3G:
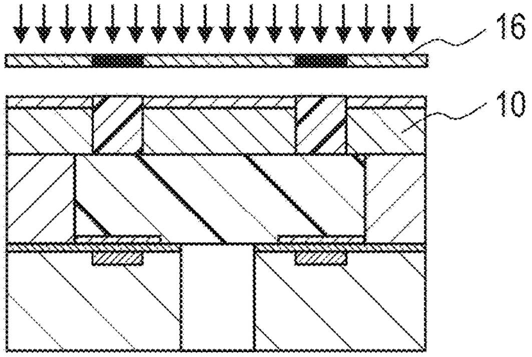
FIG. 3G is a schematic cross-sectional view showing a step of exposing the second resin layer to light.

As shown in FIG. 3G, the second resin layer 15 and the liquid-repellent layer 11 are pattern-exposed through the ejection port forming mask 16 having an ejection port pattern. Further, the exposed portion is cured by performing a heat treatment (PEB) to form the ejection port forming member 10. The exposure intensity for curing the second resin layer 15 is set to be less than the exposure intensity for curing the first resin layer 13 when the second resin layer 15 is exposed to exposure light including light having the same wavelength as that of the first resin layer 13. That is, in a case where the light transmitted through the second resin layer 15 has the exposure intensity for curing the unexposed portion of the first resin layer 13 when the second resin layer 15 is exposed to light, the unexposed portion of the first resin layer 13 is difficult to remove in a development step, and thus the channel 7 cannot be formed with high accuracy. Therefore, in a case where the second resin layer 15 is exposed to exposure light including light with the same wavelength as that of the first resin layer 13, the photosensitive resin composition (2) may have sensitivity relatively higher than that of the photosensitive resin composition (1). The ejection port forming mask 16 is obtained by forming a light-shielding film such as a chromium film on a substrate formed of a material such as glass or quartz that transmits light having an exposure wavelength according to the pattern of the ejection port. As the exposure device, a projection exposure device having a single-wavelength light source such as an i-line exposure stepper or a KrF stepper and a broad-wavelength light source of a mercury lamp such as a mask aligner MPA-600 Super (trade name, manufactured by CANON INC.) can be used.

Figure 3H:
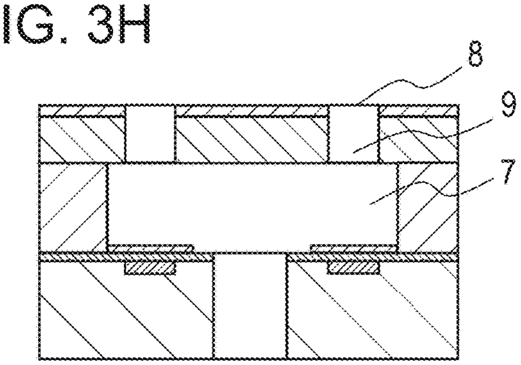
FIG. 3H is a schematic cross-sectional view showing the liquid ejection head.

As shown in FIG. 3H, unexposed portions (uncured portion) of the first resin layer 13, the second resin layer 15, and the liquid-repellent layer 11 are developed with a developing solution to be removed all at once so that the channel 7, the ejection port 8, and the nozzle portion 9 are formed. As necessary, the heat treatment is further performed to complete the liquid ejection head. Examples of the developing solution include propylene glycol monomethyl ether acetate (PGMEA), methyl isobutyl ketone (MIBK), and xylene. Further, a rinse treatment may be performed with isopropyl alcohol (IPA) as necessary.

According to the method of producing the liquid ejection head of the present disclosure, the second resin layer 15 is laminated on the channel forming member 6 and the first resin layer 13 after the step of pattern-exposing the first resin layer 13 to form the channel forming member in the production method described above. However, the second resin layer 15 can also be laminated thereon before the exposure of the first resin layer 13 to light.

Further, according to the above-described method of producing the liquid ejection head of the present disclosure, the channel forming member 6 and the ejection port forming member 10 are formed of two layers, but the present disclosure is not limited to this form. Further, each member may be formed using a small number or a plurality of photosensitive resins. For example, the liquid ejection head may be prepared by using the photosensitive resin composition (1) as an adhesive layer and using different photosensitive resin compositions for the channel forming member and the ejection port forming member. Further, the channel forming member and the ejection port forming member may be formed of the photosensitive resin composition (1) of the present disclosure using a mold material or the like.

Further, a case where the channel forming member 6 is formed in contact with the inorganic material layer 4 has been describe above, but the present disclosure can be applied to any case as long as the channel forming member 6 is in contact with an inorganic material, that is, a material having a metal atom on the substrate. This is because, for example, in a case where the channel forming member 6 is directly formed on the substrate when the substrate is formed of an inorganic material such as silicon (Si), the channel forming member 6 is in contact with Si or $SiO_2$ which is a natural oxide. Further, the channel forming member 6 may be in contact with the protective layer 5 formed of Ta or Ir.

Photosensitive Resin Composition

The photosensitive resin composition of the present disclosure will be described below.

The photosensitive resin composition (1) and the photosensitive resin composition (2) constituting the channel forming member and the ejection port forming member in the present disclosure can be a cationic polymerization type epoxy resin composition. The cationic polymerization type epoxy resin composition can be used from the viewpoints of adhesion performance, mechanical strength, liquid (ink) resistance, swelling resistance, reactivity as a photolithography material, resolution, and the like of the cured substance.

More specifically, a photocationic polymerization type epoxy resin composition containing a polyfunctional epoxy resin having any one or more of bisphenol A type and F type epoxy resins (bisphenol skeleton), phenol novolac type epoxy resins (phenol novolac skeleton), cresol novolac type epoxy resins (cresol novolac skeleton), a norbornene skeleton, a terpene skeleton, a dicyclopentadiene skeleton, and an oxycyclohexane skeleton can be used.

Further, a bi- or higher functional epoxy resin can be used. The use of a bi- or higher functional epoxy resin is suitable for three-dimensional crosslinking of the cured substance and obtaining desired characteristics.

In a case where the photosensitive resin composition (1) disposed on the inorganic material layer 4 has a microstructure obtained by being transferred while the substrate having an opening and a recess is heated, the photosensitive resin composition (1) may have heat resistance to the heating step from the viewpoint of the stability of the pattern shape. For example, in a case where the photosensitive resin composition (1) is formed into a dry film and is transferred to the substrate while the substrate having an opening and a recess is heated and in a case of performing other heating steps such as a heat treatment (PEB) after light exposure, the layer can have film hardness such that the layer is not deformed even in an uncured state. Therefore, the epoxy resin of photosensitive resin composition (1) can have a high weight-average molecular weight, and specifically, an epoxy resin having a weight-average molecular weight (Mw) of 5000 to 100000 and a softening point of 90° C. or higher can be used. When the Mw thereof is 5000 or greater, the film hardness is improved, the unexposed portion of the first resin layer 13 formed of the photosensitive resin composition (1) can be suppressed from greatly falling into the supply port 3 which is an opening portion of the substrate in a case of transfer or other heating steps. When the unexposed portion of the first resin layer 13 greatly falls from the opening portion, the height of each resin layer is non-uniform. The similar falling may occur even in a case where the softening point of the epoxy resin is lower than 90° C. Meanwhile, when the weight-average molecular weight (Mw) thereof is 100000 or less, the crosslinking density of the photosensitive resin composition is increased, and the stability of the pattern shape is enhanced. Further, from the viewpoint of the reactivity, the photosensitive resin composition (1) may have a bi- or higher functional epoxy resin in a case of having a weight-average molecular weight of 5000 or greater and desirably a tri- or higher functional epoxy resin. When the photosensitive resin composition (1) contains a tri- or higher functional epoxy resin, the crosslinking proceeds three-dimensionally, and the sensitivity thereof as a photosensitive material can be improved. The tri- or higher functional epoxy resin may have an epoxy equivalent of less than 500. When the epoxy equivalent thereof is less than 500, the sensitivity can be sufficiently obtained, and the pattern resolution and the mechanical strength and the adhesiveness of the cured substance can be suppressed from being degraded. The Mw of such resins can be calculated in terms of polystyrene using gel permeation chromatography (for example, manufactured by Shimadzu Corporation).

When a compound that contains a ligand having a lone electron pair is added, a cyclic structure is formed by a coordinate bond between the metal and the compound in the inorganic material layer, which is effective in improving the adhesiveness to the inorganic material layer.

For example, even when the microstructure comes into contact with the ink and the ink permeates into the microstructure, a rigid bond is formed at the interface between the inorganic material layer and the microstructure, and thus the microstructure is unlikely to be peeled off from the inorganic material layer. Further, since the permeation of the ink into the interface between the microstructure and the inorganic material layer is suppressed, the peeling of the microstructure is also suppressed. Meanwhile, the compound that contains a ligand having a lone electron pair deactivates an acid during the cation polymerization, and accordingly, the patterning properties may be degraded when an excessive amount of the compound is added.

Further, from the viewpoint of the adhesiveness to the inorganic material layer 4 or the like, the photosensitive resin composition (1) contains the compound containing a ligand having a lone electron pair. The ligand denotes a site that can coordinate to a metal, and has an element such as an oxygen atom or a nitrogen atom having a lone electron pair which is not directly involved in a covalent bond. When the compound that contains a ligand having a lone electron pair is added, a coordinate bond is formed with the metal in the inorganic material layer, which is effective in improving the adhesiveness to the inorganic material layer. The compound that contains a ligand having a lone electron pair forms a stable coordinate bond with a metal, preferably any of a 4-membered ring structure, a 5-membered ring structure, or a 6-membered ring structure, and more preferably a 5-membered ring structure or a 6-membered ring structure. Further, the compound that contains a ligand having a lone electron pair may have a hydrocarbon chain having 2 or more carbon atoms from the viewpoint of further suppressing permeation of a liquid.

Specific examples of the compound that contains a ligand having a lone electron pair include a compound forming a 4-membered ring with a metal, such as a compound containing an amino group such as glycine or glycylglycine or a compound containing a sulfo group such as ethyl sulfone, propyl sulfone, or butyl sulfone, a compound forming a 5-membered ring with a metal, such as 2,2-bipyridine, 1,10-phenanthroline, alanine, serine, 9,11-phenanthrenequinone, dimethylglyoxime, L-phenylalanine, or L-histidine, and a compound forming a 6-membered ring with a metal, such as salicylic aldehyde or 2-hydroxybenzoic acid.

In addition, from the viewpoint of improving the adhesiveness to the inorganic material layer, the content of the compound that contains a ligand having a lone electron pair is preferably 1.0% by mass or greater with respect to the mass of the entire epoxy resin (with respect to 100% by mass of the epoxy resin) contained in the photosensitive resin composition. Meanwhile, when the amount of the compound containing a ligand is extremely large, the curability of the photosensitive resin composition tends to be degraded, the pattern shape of a fine pattern such as a channel pattern tends to be deteriorated, and thus the amount of the compound containing a ligan is preferably less than 10.0% by mass, more preferably in a range of 1.0% by mass to 5.0% by mass, and still more preferably in a range of 1.0% by mass to 3.0% by mass.

Examples of commercially available epoxy resins that can be used in the photosensitive resin composition (1) forming into the channel forming member and the photosensitive resin composition (2) forming into the ejection port forming member include “CELLOXIDE 2021”, “GT-300” Series, “GT-400” Series, and “EHPE3150” (all trade names, manufactured by Daicel Corporation), “jER1031S”, “jER1004”, “jER1007”, “jER1009”, “jER1010”, “jER1256”, and “157S70” (all trade names, manufactured by Mitsubishi Chemical Corporation), “EPICLON N-695”, “EPICLON N-865”, “EPICLON 4050”, “EPICLON 7050”, “EPICLON HP-6000”, “EPICLON HP-4710”, “EPICLON HP-7200” Series, and “EPICLON EXA-4816” (all trade names, manufactured by DIC Corporation), “EPOX-MKR1710” (trade name, manufactured by PRINTEC CORPORATION), “DENACOL” Series (trade name, manufactured by Nagase ChemteX Corporation), and “EP-4000” Series (trade name, manufactured by ADEKA Corporation).

The photosensitive resin composition may contain a polymerization initiator. Further, the polymerization initiator may be a photopolymerization initiator. A photoacid generator selected from a sulfonic acid compound, a diazomethane compound, a sulfonium salt compound, an iodonium salt compound, a disulfone-based compound can be used as the photopolymerization initiator to be added to the photopolymerization resin composition. Examples of commercially available products thereof include “ADEKA OPTOMER (registered trademark) SP-170”, “ADEKA OPTOMER (registered trademark) SP-172”, and ADEKA OPTOMER (registered trademark) SP-150” (all trade names, manufactured by ADEKA Corporation), “BBI-103” and “BBI-102” (both trade names, manufactured by Midori Kagaku Co., Ltd.), “IBPF”, “IBCF”, “TS-01”, and “TS-91” (all trade names, manufactured by Sanwa Chemical Co., Ltd.), “CPI (registered trademark)-210”, “CPI (registered trademark)-300”, and “CPI (registered trademark)-410” (all trade names, manufactured by San-Apro Ltd.), and “Irgacure (registered trademark) 290” (trade name, manufactured by BASF Japan Ltd.).

These photoacid generators can also be used in the form of a mixture of two or more kinds thereof.

Further, a silane coupling agent can be added to the composition for the purpose of improving adhesion performance. Examples of a commercially available silane coupling agent include “Silquest A-187 (registered trademark)” (trade name, manufactured by Momentive Performance Materials Inc.).

Further, a sensitizer such as an anthracene compound, a basic substance such as amines, an acid generator that generates weakly acidic (pKa=−1.5 to 3.0) toluenesulfonic acid, or the like can also be added to the composition in order to improve the pattern resolution and adjust the sensitivity (exposure intensity required for curing). Examples of a commercially available acid generator that generates toluenesulfonic acid include “TPS-1000” (trade name, manufactured by Midori Kagaku Co., Ltd.) and “WPAG-367” (trade name, manufactured by FUJIFILM Wako Pure Chemical Corporation).

Further, commercially available negative dry film photoresists such as “SU-8” Series and “KMPR (registered trademark) 1000” (both trade names, manufactured by Nippon Kayaku Co., Ltd.), and “TMMR S2000” and “TMMF S2000” (both trade names, manufactured by TOKYO OHKA KOGYO CO., LTD.) can also be used as the photosensitive resin composition (2).

EXAMPLES

Hereinafter, the present disclosure will be described in more detail with reference to examples, but the present disclosure is not limited to such examples.

Examples 1 to 5

A liquid ejection head was prepared in each example by performing the step shown in FIGS. 3A to 3H using the photosensitive resin composition (1) listed in Table 1. The composition in each table is in units of parts by mass.

TABLE 1

| | Component | Product name | Molecular weight (Mw) | Example 1 | Example 2 | Example 3 | Example 4 | Example 5 | Comparative Example 1 | Comparative Example 2 | Comparative Example 3 |
|---|---|---|---|---|---|---|---|---|---|---|---|
| Photo-sensitive epoxy resin com-position | Tri- or higher functional epoxy resin (a) | N695 | 3400 | 100 | 100 | 100 | 100 | 100 | 100 | 100 | 100 |
| | Bifunctional epoxy resin (b) | 1009F | 22700 | 250 | 250 | 250 | 250 | 250 | 250 | 250 | 250 |
| | Compound having ligand | Glycine | — | 10.5 | 3.5 | 17.5 | 0 | 0 | 0 | 35.0 | 1.8 |
| | | Glycylglycine | — | 0 | 0 | 0 | 10.5 | 0 | 0 | 0 | 0 |
| | | Ethyl sulfone | — | 0 | 0 | 0 | 0 | 17.5 | 0 | 0 | 0 |
| | Proportion of compound having ligand with respect to 100% by mass of epoxy resin (% by mass) | | — | 3.0 | 1.0 | 5.0 | 3.0 | 5.0 | 0.0 | 10.0 | 0.5 |

TABLE 1-continued

| Component | Product name | Molecular weight (Mw) | Example 1 | Example 2 | Example 3 | Example 4 | Example 5 | Comparative Example 1 | Comparative Example 2 | Comparative Example 3 |
|---|---|---|---|---|---|---|---|---|---|---|
| Photoacid generator | 410S | — | 1.5 | 1.5 | 1.5 | 1.4 | 1.2 | 0.5 | 1.5 | 0.6 |
| | SP-172 | — | 4.8 | 4.8 | 4.8 | 4.5 | 5.8 | 3.3 | 4.8 | 5.8 |
| | TPS-1000 | — | 0.3 | 0.3 | 0.3 | 0.2 | 0.4 | 0.1 | 0.3 | 0.4 |
| Silane coupling agent | A-187 | — | 7.5 | 7.5 | 7.5 | 7.5 | 6.0 | 7.5 | 7.5 | 6.0 |
| Solvent | PGMEA | — | 500 | 500 | 500 | 500 | 500 | 500 | 500 | 500 |
| Pattern shape | | | ○ | ○ | Δ | ○ | ○ | ○ | × | ○ |
| Peeling test | | | ○ | ○ | ○ | ○ | ○ | × | ○ | × |
| Print evaluation | | | Satisfactory | | | | | Degradation of print quality | | |

In the table, the product names are as follows.

N695: trade name "EPICLON (registered trademark) N695", manufactured by DIC Corporation 10091F: trade name "JER (registered trademark) 1009F", manufactured by Mitsubishi Chemical Corporation 410S: trade name "CPI (registered trademark)-410S", manufactured by San-Apro Ltd.

SP-172" trade name "ADEKA OPTOMER (registered trademark) SP-172", manufactured by ADEKA Corporation TPS-1000: manufactured by Midori Kagaku Co., Ltd.

A-187: trade name "Silquest A-187 (registered trademark), manufactured by Momentive Performance Materials Inc.

PGMEA: propylene glycol monomethyl ether acetate

First, as shown in FIG. 2A, a PET film having a thickness of 100 μm was prepared as a film base material 21.

Next, as shown in FIG. 2B, the PET film was coated with the photosensitive resin composition (1) having the composition listed in Table 1 using a spin coating method. Further, the composition was baked at 90° C. for 10 minutes to volatilize the PGMEA solvent, and a first resin layer 13 having a thickness of 15.0 μm was formed as a resin layer 22, thereby preparing a dry film.

Next, as shown in FIG. 3A, a substrate formed of silicon, which had an energy generating element 2 formed of tantalum silicon nitride (TaSiN) on the surface side thereof was prepared.

Next, as shown in FIG. 3B, Ta was formed to have a thickness of 100 nm on the surface side of the substrate 1 as the inorganic material layer 4 and the protective layer 5 by a sputtering method such that the energy generating element 2 was covered with Ta. Further, the inorganic material layer 4 and the protective layer 5 were patterned by performing a photolithography step and reactive ion etching.

Next, as shown in FIG. 3C, a supply port 3 was formed. The supply port 3 was formed by forming an etching mask having an opening using a positive photosensitive resin formed of OFPR (manufactured by TOKYO OHKA KOGYO CO., LTD.) and performing reactive ion etching through the opening of the etching mask. The reactive ion etching was performed by a bosch process using an ICP etching device (manufactured by Alcatel, model number: 8E). The etching mask was removed using a stripping solution after the formation of the supply port 3.

Next, as shown in FIG. 3D, the first resin layer 13 formed of the photosensitive resin composition (1) listed in Table 1 was formed. Specifically, the first resin layer 13 was transferred to the substrate 1 in which the energy generating element 2 and the supply port 3 were disposed while the dry film having the first resin layer 13 prepared above was heated at 70° C. and pressed. Thereafter, the PET film was peeled from the first resin layer 13 using peeling tape (not shown).

Next, as shown in FIG. 3E, the first resin layer 13 was pattern-exposed with an exposure intensity of 16000 J/m$^2$ using an i-line exposure stepper (trade name: i5, manufactured by CANON INC.) through a channel forming mask 14 having a channel pattern. Further, the first resin layer 13 was subjected to a heat treatment at 50° C. for 5 minutes to cure the exposed portion, thereby forming a channel forming member 6.

Next, as shown in FIG. 4H, a second resin layer 15 formed of a photosensitive resin composition (2) was laminated on the channel forming member 6. First, a PET film having a thickness of 100 μm was coated with the photosensitive resin composition (2) listed in Table 2, the composition was baked at 90° C. for 5 minutes to volatilize the solvent, and the second resin layer 15 having a thickness of 5.0 μm was formed in the same manner as that for the dry film having the first resin layer, thereby forming a dry film. Next, the second resin layer 15 of the dry film was transferred to and laminated on the channel forming member 6 in the unexposed portion and the exposed portion of the first resin layer 13 while the second resin layer 15 was heated at 50° C. using a lamination method.

TABLE 2

| | Product name | Parts by mass |
|---|---|---|
| Epoxy resin | 157S70 | 100 |
| Photoacid generator | 410S | 0.5 |
| Silane coupling agent | A-187 | 5 |
| Solvent | PGMEA | 140 |

In the table, the product name is as follows.

157S70: trade name "jER (registered trademark) 157S70", manufactured by Mitsubishi Chemical Corporation As shown in FIG. 3G, the second resin layer 15 was pattern-exposed with an exposure intensity of 1100 J/m$^2$ using an i-line exposure stepper (trade name: i5, manufactured by CANON INC.) through an ejection port forming mask 16 having an ejection port pattern. Further, the exposed portion was cured by performing a heat treatment at 90° C. for 5 minutes, thereby forming an ejection port forming member 10.

As shown in FIG. 3H, the uncured portions of the first resin layer 13 and the second resin layer 15 were developed with PGMEA for 1 hour to be removed all at once to form a channel 7, an ejection port 8, and a nozzle portion 9, and the channel 7, the ejection port 7, and the nozzle portion 9 were cured with heat at 200° C., thereby obtaining a liquid ejection head.

Comparative Examples 1 to 3

In Comparative Examples 1 to 3, each liquid ejection head was prepared in the same manner as in the examples using the photosensitive resin composition (1) having the composition listed in Table 1.

Evaluation

Pattern Shape

In each of the liquid ejection heads prepared in Examples 1 to 5 and Comparative Examples 1 to 3, the channel width of the channel forming member 6 in contact with the inorganic material layer 4 was measured with a white interference microscope (manufactured by Hitachi High-Tech Corporation) after the development step performed on each liquid ejection head. Further, the pattern shape was determined from the ratio of the channel width to the mask value (15 μm) according to the criteria listed in Table 3.

The evaluation results of the pattern shape are listed in Table 1. The liquid ejection heads prepared in Examples 1 to 5 had satisfactory pattern reproducibility. On the contrary, in Comparative Example 2, since a large amount of the compound containing a ligand was added to the photosensitive epoxy resin composition, the curability of the channel forming member was degraded, the channel width was deviated from the mask value, and the pattern reproducibility was degraded.

TABLE 3

| Channel width/mask value (15 μm) | 0.9 or greater | Less than 0.9 and 0.8 or greater | Less than 0.8 |
|---|---|---|---|
| Pattern reproducibility | ○ | Δ | × |

Peeling Test (Ink Resistance)

The channel of each of the liquid ejection heads prepared in Examples 1 to 5 and Comparative Examples 1 to 3 was filled with the ink formed of the components listed in Table 4, and allowed to stand in an oven at 80° C. for 90 days.

TABLE 4

| Blended component | Parts by mass |
|---|---|
| Diethylene glycol | 10.0 |
| 2-Pyrrolidone | 5.0 |
| 1,2-Hexanediol | 7.0 |
| Triethylene glycol monobutyl ether | 25.0 |
| Acetynol | 1.0 |
| Black pigment | 3.0 |
| Pure water | 49.0 |

The bonding state between the inorganic material layer and the channel forming member after the standing at 80° C. for 90 days was observed with a metallurgical microscope, and evaluated according to the following criteria.

Evaluation Criteria

O: Peeling did not occur between the inorganic material layer and the channel forming member.

X: Peeling occurred between the inorganic material layer and the channel forming member.

The results of the peeling test (ink resistance) are listed in Table 1. In the liquid ejection heads prepared in Examples 1 to 5, peeling was not observed between the inorganic material layer and the channel forming member, and the ink resistance was satisfactory.

In Comparative Examples 1 and 3, since almost no compound containing a ligand was added to the composition, the adhesiveness between the inorganic material layer and the channel forming member was degraded, and peeling was observed between the inorganic material layer and the channel forming member, which was not observed when the liquid ejection head was completed.

Print Evaluation

The print evaluation was performed by filling each of the liquid ejection heads prepared in the examples and the comparative examples with the same ink as the ink used in the peeling test (ink resistance), allowing the liquid ejection head to stand at 70° C. for 90 days, and performing printing.

In the liquid ejection heads prepared in Examples 1 to 5, the results of the print evaluation were satisfactory. On the contrary, in Comparative Examples 1 to 3, degradation of the print quality was observed due to degradation of the pattern reproducibility and occurrence of partial peeling between the inorganic material layer and the channel forming member.

As described above, according to the present disclosure, even when an ink with high permeability into the channel forming member is used, the channel forming member can be suppressed from being peeled off from the substrate by preventing permeation of the ink into the channel forming member. Further, it is possible to provide a liquid ejection head with excellent pattern reproducibility and a satisfactory print quality.

According to an embodiment of the present disclosure, the channel forming member can be suppressed from being peeled off from the substrate by preventing permeation of an ink into the channel forming member even when an ink with high permeability is used, and thus it is possible to provide a liquid ejection head with excellent pattern reproducibility and a satisfactory print quality.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2023-187716, filed on Nov. 1, 2023, which is hereby incorporated by reference herein in its entirety.

What is claimed is:

1. A liquid ejection head comprising:

a substrate;

an ejection port forming member; and a channel forming member, wherein the ejection port forming member and the channel forming member are provided on the substrate, the channel forming member is a cured substance of a photosensitive resin composition formed of a resin and a compound that contains a ligand having a lone electron pair, and is in contact with the substrate including an inorganic material layer on a surface thereof, and a content of the compound that contains a ligand having a lone electron pair is in a range of 1.0% by mass to 5.0% by mass with respect to 100% by mass of an epoxy resin contained in the photosensitive resin composition.

2. The liquid ejection head according to claim 1, wherein the compound that contains a ligand having a lone electron pair forms a coordinate bond with a metal in the inorganic material layer and forms any of a 4-membered ring structure, a 5-membered ring structure, or a 6-membered ring structure.

3. The liquid ejection head according to claim 1, wherein the compound that contains a ligand having a lone electron pair has a hydrocarbon chain having 2 or more carbon atom.

4. The liquid ejection head according to claim 1, wherein the resin is an epoxy resin having at least any one or more of a bisphenol skeleton, a phenol novolac skeleton, a cresol novolac skeleton, a norbornene skeleton, a terpene skeleton, a dicyclopentadiene skeleton, and an oxycyclohexane skeleton.

5. The liquid ejection head according to claim 4, wherein the epoxy resin includes a bi- or higher functional epoxy resin.

6. The liquid ejection head according to claim 4, wherein the epoxy resin includes a bi- or higher functional epoxy resin and a tri- or higher functional epoxy resin.

7. The liquid ejection head according to claim 1, wherein the photosensitive resin composition contains a polymerization initiator.

8. The liquid ejection head according to claim 7, wherein the polymerization initiator is a photoacid generator.

9. The liquid ejection head according to claim 1, wherein the inorganic material is at least one metal selected from Ta, Ir, W, Ti, Pt, Au, Pd, Cu, Al, and Si or at least one selected from the group consisting of silicon oxide ($SiO_2$), silicon nitride (SiN), silicon carbide (SiC), silicon carbonitride (SiCN), and silicon carbonate (SiOC).

10. A liquid ejection head comprising:

a substrate;

an ejection port forming member; and a channel forming member, wherein the ejection port forming member and the channel forming member are provided on the substrate, the channel forming member is a cured substance of a photosensitive resin composition formed of a resin and a compound that contains a ligand having a lone electron pair, and is in contact with the substrate including an inorganic material layer on a surface thereof, a content of the compound that contains a ligand having a lone electron pair is in a range of 1.0% by mass to 5.0% by mass with respect to 100% by mass of an epoxy resin contained in the photosensitive resin composition, and the compound that contains a ligand having a lone electron pair forms a coordinate bond with a metal in the inorganic material layer and forms any of a 4-membered ring structure, a 5-membered ring structure, or a 6-membered ring structure.

11. The liquid ejection head according to claim 10, wherein the compound that contains a ligand having a lone electron pair has a hydrocarbon chain having 2 or more carbon atom.

12. The liquid ejection head according to claim 10, wherein the resin is an epoxy resin having at least any one or more of a bisphenol skeleton, a phenol novolac skeleton, a cresol novolac skeleton, a norbornene skeleton, a terpene skeleton, a dicyclopentadiene skeleton, and an oxycyclohexane skeleton.

13. The liquid ejection head according to claim 12, wherein the epoxy resin includes a bi- or higher functional epoxy resin.

14. The liquid ejection head according to claim 12, wherein the epoxy resin includes a bi- or higher functional epoxy resin and a tri- or higher functional epoxy resin.

15. The liquid ejection head according to claim 10, wherein the photosensitive resin composition contains a polymerization initiator.

16. The liquid ejection head according to claim 15, wherein the polymerization initiator is a photoacid generator.

17. The liquid ejection head according to claim 10, wherein the inorganic material is at least one metal selected from Ta, Ir, W, Ti, Pt, Au, Pd, Cu, Al, and Si or at least one selected from the group consisting of silicon oxide ($SiO_2$), silicon nitride (SiN), silicon carbide (SiC), silicon carbonitride (SiCN), and silicon carbonate (SiOC).

18. A method of producing a liquid ejection head, the method comprising:

forming a first resin layer formed of a photosensitive resin composition (1) on a substrate and performing light exposure and development on the first resin layer to form a channel forming member; and laminating a second resin layer formed of a photosensitive resin composition (2) on the formed channel forming member and performing light exposure and development on the second resin layer to form an ejection port forming member, wherein the photosensitive resin composition (1) is a photosensitive resin composition containing an epoxy resin, a polymerization initiator, and a compound that contains a ligand having a lone electron pair, and a content of the compound that contains a ligand having a lone electron pair is 1.0% by mass or greater and less than 10.0% by mass with respect to 100% by mass of the epoxy resin.

* * * * *